United States Patent [19]

Amoroso

[11] 3,925,729

[45] Dec. 9, 1975

[54] SKIRT-TUNED SINGLE OSCILLATOR TRANSCEIVER

[75] Inventor: Salvatore Amoroso, Fairfield, Conn.

[73] Assignee: United Technologies Corporation, Hartford, Conn.

[22] Filed: Aug. 29, 1974

[21] Appl. No.: 501,722

[52] U.S. Cl. .................... 325/17; 325/20; 343/179

[51] Int. Cl.$^2$ .......................................... H04B 1/40

[58] Field of Search ............ 325/17, 18, 20, 23, 24, 325/63, 184; 343/179, 180

[56] References Cited

UNITED STATES PATENTS

| | | | |
|---|---|---|---|
| 2,460,781 | 2/1949 | Cantelo | 325/17 |
| 2,757,279 | 7/1956 | Vosburgh | 343/179 |
| 2,933,598 | 4/1960 | Heller et al. | 325/17 X |

*Primary Examiner*—Benedict V. Safourek
*Attorney, Agent, or Firm*—M. P. Williams

[57] ABSTRACT

A transceiver, adapted for use as either a master or a slave in a duplex pair, has a single, voltage-tunable, solid state oscillator to provide the carrier frequency wave, a small portion of which is mixed with the received wave and applied therewith to a single ended mixer; an AGC-controlled loop cancels transmitter input modulation from the receiver output. The oscillator of the slave transceiver is locked to a desired carrier frequency by a feedback loop including a tuning cavity adjusted to the same frequency as that of the master transceiver; the slave transceiver is first locked to a frequency on the skirt of its tuning cavity, differing from the center frequency of its tuning cavity by the common IF frequency and thereafter, upon sensing output from its IF amplifier (from the master), is switched to operate in response to AFC controlled by the received signal, such that the master and slave transceivers are locked together at frequencies differing by their common IF frequency. A single integrating amplifier provides demodulator and AFC filtering and, together with a unilaterally-effective bistable device, initial sweeping of the oscillator control voltage to achieve skirt tuning in the slave mode or center tuning in the master mode.

8 Claims, 3 Drawing Figures

SKIRT-TUNED SINGLE OSCILLATOR TRANSCEIVER

CROSS-REFERENCE TO RELATED APPLICATIONS

This invention is an improvement on and employs some of the claimed features of my commonly owned copending basic application Ser. No. 501,721 filed on even date herewith and entitled SINGLE OSCILLATOR MICROWAVE TRANSCEIVER, a continuation in part of Ser. No. 337,609, filed on Mar. 2, 1973, now abandoned. The subject matter and disclosure herein is in part similar to that of my commonly owned copending application Ser. No. 501,727, filed on even date herewith and entitled FREQUENCY STABILIZED SINGLE OSCILLATOR TRANSCEIVERS.

BACKGROUND OF THE INVENTION

Field of Invention

This invention relates to transceivers, and more particularly to frequency stabilized transceivers in which a slave transceiver is guaranteed to lock onto a frequency offset from the frequency of a related master transceiver.

Description of the Prior Art

A recent innovation in communications has been the utilization of microwave transceivers for line-of-sight transmission, typically as an alternative to hardwired connections between transmitting and receiving units. The apparatus may be utilized at extremely high frequencies, with carriers in the millimeter wave bands, thus providing them with a rather directional transmission characteristic which renders them useful in providing relatively secure transmission as well as avoiding interference with adjacent units in crowded areas (such as in building-to-building installations in cities).

In my aforementioned basic application, a single solid state oscillator has permitted employment of a single ended mixer (depending upon the characteristics of the solid state oscillator in use) may have insufficient open loop stability to meet FCC carrier frequency stability requirements and may have an extremely wide tuning range. Therefore, the frequency of oscillation of the voltage tunable solid state oscillator in my aforementioned similar application is stabilized by means of a feedback loop including a high Q, resonant cavity with the tuning voltage swept initially until the oscillator can lock onto the cavity frequency; in the case of matched transceivers which are designed for duplex operation, the slave transceiver is locked to a frequency separated from the master transceiver frequency by the IF frequency of both transceivers, such that the slave receiver operates on the upper sideband of the master transmitter frequency while the master receiver operates on the lower sideband of the slave transmitter (or vice versa). In said similar application, the slave transceiver has its oscillator swept in frequency until it locks on its own cavity, and then switches to lock onto an AFC signal generated in its receiver, as a result of reception of a signal having a frequency separated from the master transmitter by the IF frequency. This avoids problems related to the voltage/frequency characteristics of solid state oscillators varying considerably from one unit to the next, and varying for any given oscillator due to long term drift, temperature variations, and so forth.

However, this requires that the master and slave units have cavities tuned to separate frequencies, so that they are not fully interchangeable. This requires separate production treatment, and in-field readjustment to switch from master mode to slave mode.

SUMMARY OF INVENTION

Objects of the present invention include provision of improved frequency stability of interchangeable master and slave transceivers designated to operate in a duplex pair.

According to the present invention, a transceiver employing a voltage-tunable solid state oscillator includes a frequency stability feedback loop having means for sweeping the voltage input of the oscillator until it locks onto a frequency on the skirt of the frequency-stabilizing element characteristic, separated from the center frequency thereof by the design IF frequency.

According further to the present invention, a transceiver includes a slave mode in which it has the ability to first lock onto a frequency on the skirt of a frequency stability feedback loop as described hereinbefore, and thereafter to shift to AFC operation in response to signals received from a master transceiver operating with it in a duplex pair, only after it has generated a significant receiver output indicating that its oscillator is operating at a proper frequency so as to provide the correct local oscillator frequency for maximum signal to pass through to the receiver at the IF frequency.

In the present invention, the sweep control voltage is provided by an integrating amplifier which feeds and is unilaterally fed by a bistable device in a closed loop, the amplifier also having inputs responsive to AFC error voltage and to the frequency stability loop error voltage, the amplifier input gains being adjusted such that either the AFC or the frequency stability loop will swamp out the Schmidt trigger input in both master and slave modes, with no need to disconnect the voltage sweeping circuitry when in stable operation.

In accordance still further with the present invention, the frequency stability loop includes a single resonant cavity, of the same frequency in units designed for selective designation as master or slave, and a synchronous demodulator responsive to transmitter input modulation, thereby to provide a DC carrier frequency control signal having opposite polarity (determined by the sense of the frequency error) in master and slave modes, to thereby have the master lock to the center cavity frequency, and the slave to a frequency off-center by the design IF frequency, after which it will shift to AFC operation.

The present invention provides for the utilization of voltage-controlled solid state oscillators in single oscillator transceiver configurations with absolute assurance that the slave transceiver will lock onto the controlled frequency of the master transceiver, with cavities of the same frequency in the master and slave modes.

Other objects, features and advantages of the present invention will become more apparent in the light of the following detailed description of a preferred embodiment thereof, as illustrated in the accompanying drawing.

DESCRIPTION OF THE PREFERRED EMBODIMENT

Figure 1:
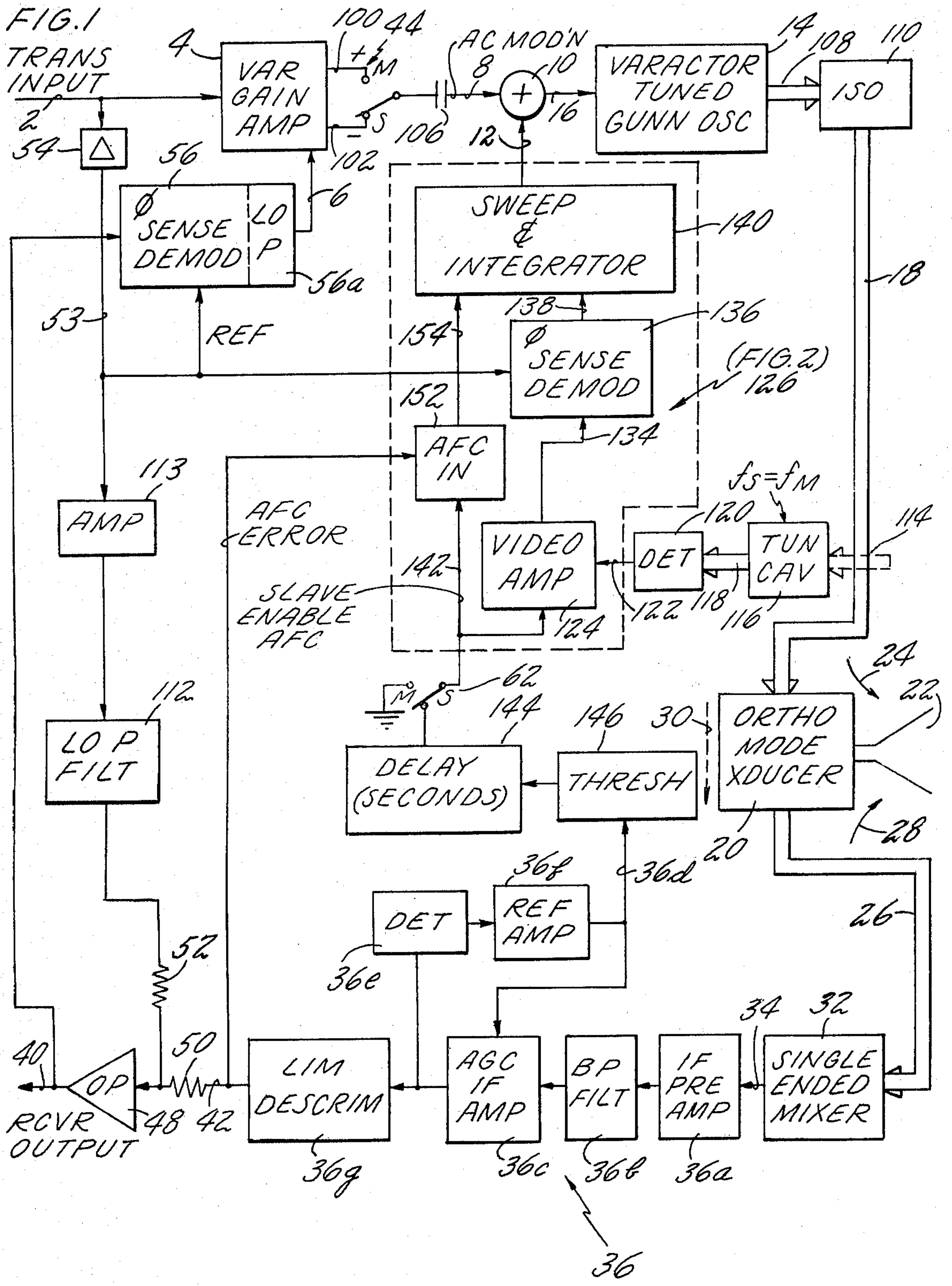
FIG. 1 is a block diagram of a preferred embodiment of the present invention.

An exemplary embodiment of the present invention is illustrated in FIG. 1 in a fashion which is commensurate with the illustration in my aforementioned applications, and elements of FIG. 1 herein which are the same as or similar to corresponding elements of my aforementioned applications are identified with the same reference numerals.

In FIG. 1, information to be transmitted by the transceiver, which may comprise either analog or digital information, is represented by signals applied to a transmitter input line 2 and is referred to hereinafter as transmitter input modulation. This may be provided from a limiter or AGC controlled amplifier (not shown) so that the amplitude excursion is carefully regulated, if desired, in order to limit the FM excursion of transmissions, as described hereinafter. This is applied to a variable gain amplifier 4, the gain of which is controlled by an AGC signal on a line 6 in a manner which is described more fully hereinafter. The amplifier 4 has a pair of bipolar outputs 100, 102 which are referred to herein as + and − in an arbitrary fashion simply for reference purposes, the significance simply being that they are opposite and by virtue of the positioning of a related switch 44 into either a master (M) or slave (S) position, can bear a known relationship to the polarity and/or phase of other signals, as described hereinafter. From the switch 44, the amplifier output is AC coupled, such as through a capacitor 106 and over a line 8 to a summing junction 10, to be added to a DC carrier frequency control voltage on a line 12 so as to provide a frequency control voltage to a solid state, voltage-tunable oscillator, such as a varactor tuned Gunn oscillator 14, over a line 16.

Output coupled from the oscillator 14 is provided over a waveguide or other suitable transmission line 108 to an isolator 110 and over a waveguide 18 to an orthomode transducer 20. The isolator 110 prevents reflected waves which may be generated in the waveguide 18, as a result of impedance mismatching, from feeding back to the Gunn oscillator and causing frequency variations therein. The isolator 110 may comprise a well known circulator in which only two ports are utilized, and any additional ports are provided with a lossy termination. The orthomode transducer couples the transmitted wave from the oscillator 14 to an antenna means 22, as indicated by the arrow 24. The orthomode transducer 20 also couples waves received by the antenna means 22 to a waveguide 26 as indicated by an arrow 28. A small amount of the transmitter wave from the oscillator 14 is also coupled to the waveguide 26 as indicated by the broken arrow 30. This portion of the transmitter wave is used to mix with the received wave in the waveguide 26 so as to provide a beat frequency in a single ended mixer 32 such that the output thereof, on a suitable transmission line 34 (which may preferably comprise coaxial cable) will be at the IF frequency of a receiver 36.

The receiver 36 typically includes a matching preamplifier 36*a* designed to interface properly with the output of the single ended mixer, followed by a bandpass filter 36*b*, for noise rejection, and an AGC IF amplifier 36*c*, having its gain controlled by another AGC signal on a line 36*d*. The AGC signal is developed by a detector 36*e* feeding a differential amplifier 36*f* which has a reference for comparison with the detector output, in conventional fashion. The gain-controlled output of the amplifier 36*c* feeds a limiter/discriminator stage 36*g* which consists of a suitable number of amplitude-limiting IF amplifier stages followed by an FM discriminator which supplies the desired audio or video output. However, the output of the receiver 36 contains not only the audio or video relating to the modulation of the carrier wave received at the antenna 22 from a similar, remote transceiver, but also includes the modulation of the transmitter wave from the oscillator 14 in this transceiver, which is leaked through the orthomode transducer 20 to serve as a local oscillator signal. The transmitter modulation must be cancelled from the receiver output in order to provide a receiver output signal on a line 40 which is a faithful reproduction of the signal received at the antenna 22 from the remote transmitter.

In order to achieve transmitter modulation cancellation, the output of the receiver 36 is applied over a line 42 through a resistor 50 to a junction with another resistor 52 for application to the input of an operational amplifier 48. The resistor 52 receives signals from a low pass filter 112 which provides the same pulse shaping characteristics to signals passed by an amplifier 113 from a line 53 as the bandpass filter 36*b* provides to the modulation passing through the receiver 36. This is not necessary in the case of low frequency analog modulation or low data rates of digital modulation, but as data rates increase, and bit times decrease, for maximum cancellation characteristics, an approximate equalization of pulse shapes is required, and therefore the matching of the transmitter input modulation applied by the low pass filter 112 with that applied by the receiver 36 becomes more and more critical.

The signal on the line 53 is provided by a delay unit 54 which is in turn responsive to the transmitter input modulation signal on the line 2. The delay period of the delay unit 54 is set to equal circuit propagation time from the line 2, through the variable gain amplifier 4, the oscillator 14, the transducer 20, the mixer 32 and the receiver 36 so that the phase of the modulation as it passes through the resistor 50 to the input of the amplifier 48 will be exactly opposite to the phase of signals applied through the resistor 52 to the input of the amplifier 48. This causes cancellation of the transmitter input modulation, providing only that the amplitudes are the same. In order to provide equal amplitudes, the output of the amplifier 48 is applied to the signal input of a phase sensitive demodulator (or synchronous demodulator) 56 and the reference input thereto is taken from the line 53. Since this provides synchronous full wave rectification of the output of the amplifier 48, the rectification being in phase with the reference signal which comprises the delayed transmitter input modulation, any transmitter input modulation remaining in the output of the receiver 48 will cause a time varying DC signal to pass, after smoothing by a low pass filter 56*a*, to the gain control input of the amplifier 4 over the AGC line 6. This, in turn, adjusts the gain of modulation provided to the oscillator 14 either upwardly or downwardly in such a fashion that the transmitter input modulation is totally cancelled at the output of the amplifier 48. Provision of the amplifier 113 between the low pass filter 112 and the delay unit 54 provides a rough adjustment of the level of cancellation signal through the resistor 52 in contrast with the desired magnitude of reference signal on a line 53 and the desired ratio of modulation voltage to DC control voltage in the oscillator 14, for a proper frequency excursion in the FM transmission. Provision of automatic gain control to the amplifier 4 in response to nulling of transmitter modulation at the output of the operational amplifier 48 thereby provides for a closed loop, complete cancellation of transmitter input modulation from the receiver output signal on a line 40. It also provides closed-loop control over the oscillator frequency excursion, to the same degree as the amplitude of the transmitter input modulation is controlled on line 2 (such as by AGC or limiter circuits, not shown).

A portion of the transmitter wave in the waveguide 18 is coupled into a waveguide 114 for application to a high Q cavity 116 having a resonant transmission characteristic, the output of which is applied over a waveguide 118 to a microwave crystal detector 120. This provides a detected, A.M. signal on a line 122 which has zero amplitude when the carrier frequency of the oscillator 14 is adjusted to the peak of the gain curve of the cavity (at its resonant frequency, $f_c$), and has amplitude proportional to the amount of which $f_o$ differs from $f_c$ with polarity dependent upon whether the oscillator is tuned below the peak of the cavity or above the peak of the cavity. This is applied to a video amplifier 124, which is a portion of a frequency control circuit 126*a*. The output of the amplifier 124 on a line 134 is applied to the signal input of a phase sensitive demodulator 136. The reference input to the phase sensitive demodulator 136 comprises the reference signal on the line 53. As is known, if there is modulation on the RF signal (as is true in the present case) the phase sensitive demodulation of the detector output will provide a frequency dependent signal on a line 138 with amplitude proportional to the amount by which the oscillator frequency varies from the frequency of the tuning cavity 116, and polarity indicative of the sense of the frequency error. Such a frequency modulation stabilizer is described in Section 19.2.2 of Harvey, A. F., *MICROWAVE ENGINEERING*, Academic Press: New York and London, 1963. This signal is smoothed in a sweep and integrator circuit 140*a* (the details of which are discussed hereinafter with respect to FIG. 2) for application as the DC carrier frequency controlling voltage on the line 12.

Figure 2:
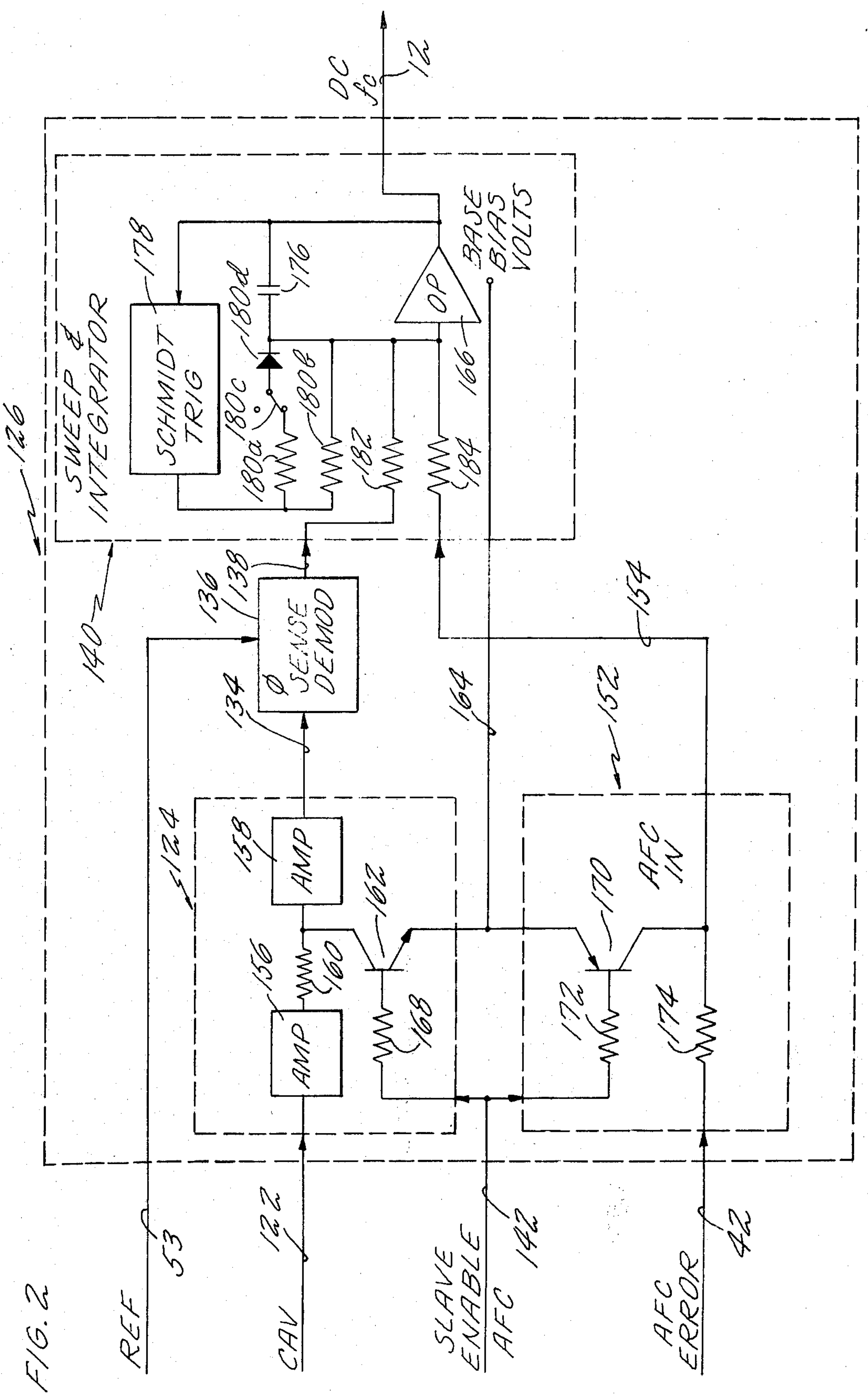
FIG. 2 is a schematic block diagram of frequency control apparatus included in the transceiver embodiment of FIG. 1.

Referring now to FIG. 2, the frequency control circuitry 126*a* is shown in the same fashion as in FIG. 1 except that additional detail is shown with respect to the video amplifier 124, the sweep and integrator circuit 140*a*, and the AFC input control circuit 152.

The video amplifier 124 (FIG. 2) comprises a pair of video amplifier stages 156, 158 connected by a resistor 160. The input to the amplifier 158 is connected through an NPN transistor 162 to a line 164 at a suitable reference potential. The reference potential on the line 164 may be ground in some circumstances, or may be base bias voltage of an operational amplifier 166 within the sweep and integrator circuitry 140, as is described more fully hereinafter. The transistor 162 is connected through a resistor 168 to the line 142 such that when the slave enable AFC signal appears on the line 142, the transistor 162 operates, pulling the input of the amplifier 158 down, thereby reducing its gain to a point where its output is no longer significant in the sweep and integrator circuit 140*a*, as is described more fully hereinafter.

The AFC input control circuit 152 similarly comprises a PNP transistor 170 which is connected through a resistor 172 to the slave enable AFC line 142. The transistor 170 normally conducts so as to cause the AFC input line 154 to be brought to the reference potential of the line 164, so as to render the AFC signal ineffective in the sweep and integrator circuitry 140 as described hereinafter. When the signal appears on the line 142, it causes cut-off of the transistor 170 so that the AFC signal is applied to the amplifier 166. The AFC input circuitry 152 also includes a buffer resistor 174 to buffer the AFC error signal on the AFC circuit 42 from the reference potential on the line 164 when the transistor 170 is conducting.

The sweep and integrator circuitry 140a comprises the operational amplifier 166, which is connected in an inverting configuration, and a feedback capacitor 176 which together comprise an active integrator, or integrating amplifier, in the well known fashion. The output of the amplifier 166 is also connected to the input of a suitable bistable device, such as a Schmidt trigger 178, an output of which is in turn connected to a pair of input resistors 180*a*, 180*b* which comprise a summing amplifier input summing junction together with a pair of other resistors 182, 184. As is known, the Schmidt trigger output will vary between an upper voltage level and a lower voltage level. Assuming there are no inputs on either of the resistors 182, 184 at any moment in time, the Schmidt trigger will be at one or the other voltage level, which is applied through the resistors 180*a*, 180*b* to the integrating amplifier 166. This causes the output to either increase or decrease, substantially linearly if the time constant represented by the resistors 180*a*, 180*b* and the capacitor 176 is sufficiently large, until the output of the operational amplifier 166 reaches the opposite threshold voltage to toggle the Schmidt trigger 178. When the trigger 178 toggles, the opposite voltage of its output will be passed through one or both of the resistors 180*a*, 180*b* to the input of the integrating amplifier 166, causing it to commence integration in the opposite direction. When set for the master mode, the switch contact 180*c* is open, so both polarities of the Schmidt trigger output will drive the integrating amplifier 166, 176 in the same manner, and the output of the integrating amplifier 166 will be substantially a sawtooth. However, the provision of the time varying voltage on the line 12 will cause commensurate slewing of the frequency of the oscillator 14 (FIG. 1) so that by the end of a full cycle of slewing in response to the sawtooth, the oscillator 14 will at some point be tuned to the frequency of the tuning cavity 116 (FIG. 1) so that there will be a significant output from the detector 120 (FIG. 1) applied on the line 122 to the video amplifier 129 (FIG. 2). Assuming that the slave enable AFC signal is not present on the line 142, the transistor 162 will not be conducting, so that the full output of the amplifier stage 156 will be provided to the input of the amplifier stage 158. Regardless of whether the unit has its switches adjusted to operate in the slave mode or the master mode, the video amplifier 124 will provide a signal over the line 134 to the signal input of the phase sensitive demodulator 136, thereby to provide to the resistor 182 a signal which indicates, by its amplitude and polarity, the magnitude and sense of the error of the oscillator center frequency with respect to the tuning cavity resonant frequency.

This will occur at a time when the Schmidt trigger is either in one state or the other, and the voltage applied by the phase sensitive demodulator 136 through the resistor 182 will be added to the voltage then being provided by the Schmidt trigger 178 through the resistor 180, in a proportion related to the ratio of the resistors 180, 182. By causing the resistor 180 to be significantly larger (one or two orders of magnitude) then the resistance of the resistor 182, the proportion of the input signal relating to the phase sensitive demodulator 136 can be orders of magnitude greater than that relating to the Schmidt trigger 178. This causes the operational amplifier 166 to provide an output on the line 12 which will tend to tune the oscillator 14 (FIG. 1) to the center frequency of the tuning cavity 116, and since this is in a closed loop, any tendency of the Schmidt trigger 178 input to integrate through the amplifier 166 and to cause the oscillator frequency to deviate from that of the tuning cavity 116 will be nulled by the closed loop operation through the phase sensitive demodulator 136. Thus, the output of the integrating amplifier 166 on the line 12 will quickly stabilize at a voltage which causes the oscillator 14 to assume the center frequency of the tuning cavity 116.

The apparatus described thus far is essentially the same as corresponding apparatus of my aforementioned similar application, to which reference may be had for further detail.

When in the slave mode, however, the switch 180*c* connects the resistor 180*a*, through the diode 180*d*, to the summing input of the amplifier 166. The resistor 180*a* is very small compared with the resistor 180*b*, and causes the amplifier input to be much higher, so the output thereof integrates to the transition voltage of the Schmidt trigger very quickly, for negative outputs of the Schmidt trigger only. Positive outputs are blocked by the diode 180*d*, so they are applied in the same fashion as for the master mode, as described hereinbefore. The net result is that there is essentially a sawtooth sweeping of the frequency control of the oscillator input, so it can lock on only to positive Schmidt trigger outputs. This causes the oscillator frequency to approach the frequency of the cavity from the same direction (low frequency side in the example herein), with the Schmidt output opposite in polarity to the output of the demodulator 136.

Figure 3:
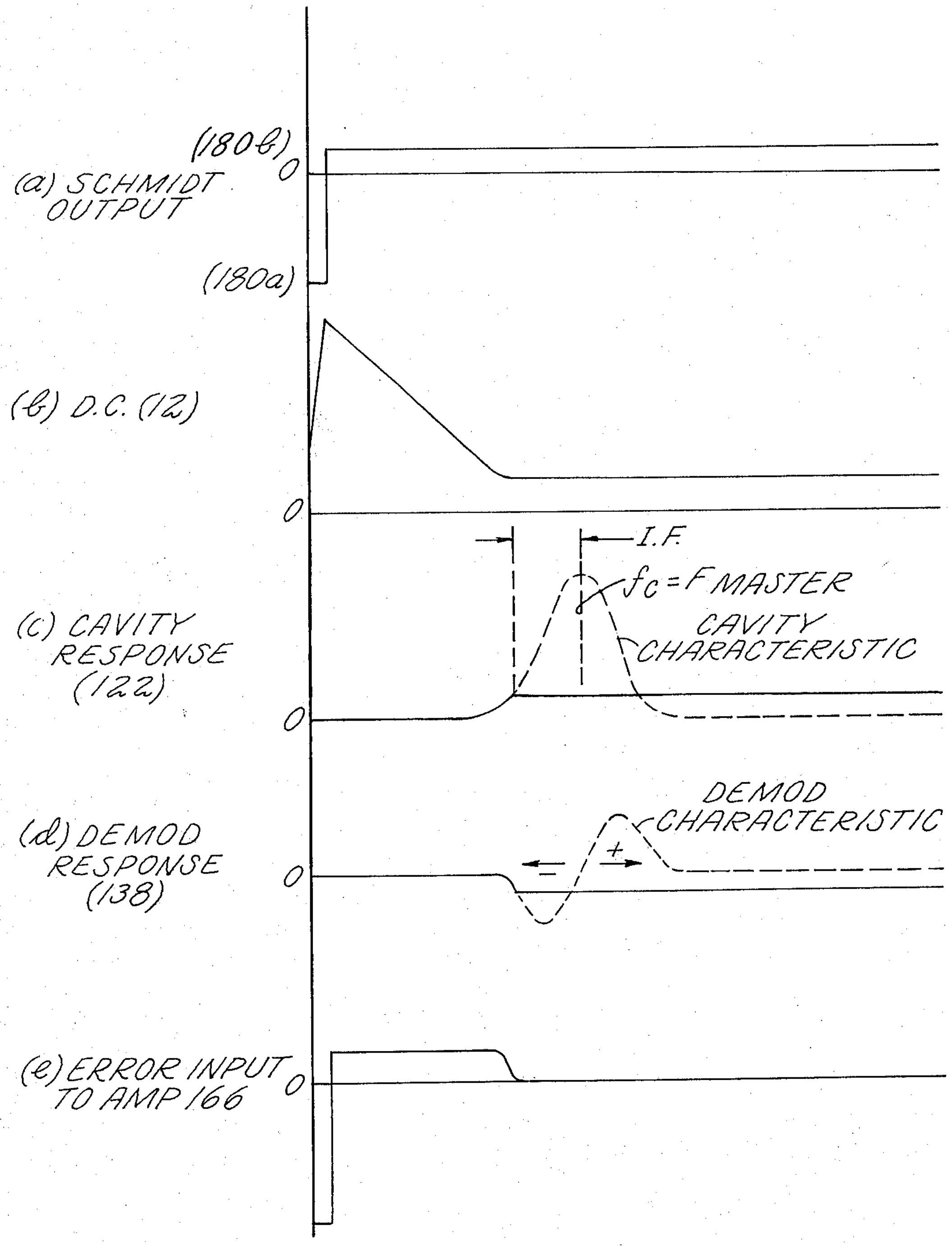
FIG. 3 is an illustration of the stability loop operating characteristics.

The operation of the frequency control circuit 126*a* (sweeping until the oscillator is locked to the skirt of the tuning cavity) is further illustrated with respect to FIG. 3. At any arbitrary point in time, the Schmidt trigger may have been providing a negative output through resistor 180*a* (illustration (a)) so that the DC frequency controlling voltage on the line 12 (illustration (*b*)) is integrating rapidly positively (due to the inversion of the amplifier 166). When it reaches the input threshold of the Schmidt trigger, the trigger will toggle, thus providing a positive output through the resistor 180*b*, as seen in illustration (*a*), FIG. 3. This will cause the output of the amplifier 166 to begin integrating in a negative direction as shown in illustration (*b*) of FIG. 3. At some point in time, the DC voltage on the line 12 is such as to cause the oscillator frequency to be within the response characteristic (illustration (*c*)) of the cavity, and therefore also within the output characteristic of the phase sensitive demodulator (illustation (*d*)). Thus, the phase sensitive demodulator 182 starts to have an output as shown in illustration (*d*). This is subtracted from the output of the Schmidt trigger (illustration (*a*)), so as to provide a decrease in the error voltage input to the amplifier 166 (illustration (*e*)), which in turn causes the DC output on line 12 (illustration (*b*)) to begin leveling off, as higher negative outputs of the demodulator are summed to the Schmidt trigger output. Then, when the output of the demodulator (illustration (*d*)) reaches a value (as scaled through resistor 182) which balances the output of the Schmidt trigger (as scaled through resistor 180*b*) the error input to the amplifier reaches zero. By proper relative scaling of the resistors 180*b*, 182, this is cause to occur at a voltage such that the oscillator is tuned to a frequency separated from the center frequency of of the cavity by the design IF frequency. The amount of this voltage is determined by the open loop gain of the operational amplifier 166 which can be extremely high (on the order of thousands) and a commensurate adjustment between the value of the resistors 180*b*, 182, all in a known fashion.

Notice that the polarities are such that if the voltage on the line 12 is decreasing, it will approach the voltage required to tune the oscillator to the skirt of the cavity (as shown in illustrations (*c*) and (*d*) of FIG. 3) with the demodulator output bucking the sweep voltage. When integrating negatively, or if for some reason, a noise input causes a sufficient input to the integrator to drive the oscillator off a resonance, it will automatically be driven far off resonance due to this polarity relationship, and no lock on will occur until the trigger 178 toggles to provide a plus input, and a negative integration. The difference in the input voltage to the amplifier 166 relating to the Schmidt output and that relating to the demodulator output (as scaled by resistors 180*b*, 182) should be on the same order of magnitude, and the relationships may be somewhat different than the manner of illustration chosen for FIG. 3 for illustrative purposes.

The sense of the output of the video amplifier 124 is chosen to be correct with respect to the sense of the transmitter modulation as determined by the switch 44 since it is necessary that the demodulated signal on the line 138 has a correct sense to buck sweep voltage when in the slave mode, and to null the difference between the frequencies of the oscillators 14 and the cavity 116 when in the master mode.

Another master/slave switch 62 is also provided so that the video amplifier 124 cannot be rendered ineffective by a signal on a line 142 when the transceiver is operating in a master mode. When it is desired to operate in the slave mode, the signal on the line 142 enables operating in response to an AFC error signal on the line 42, and also serves to disable the video amplifier 124. The switch 62 is fed by the output of a delay unit 144 which may provide any suitably long delay, such as several seconds, which in turn responds to a threshold detector 146 that senses the level of the AGC signal on the line 36*d*. The AGC signal is proportional to the level of signal passed to the IF amplifier 36*c* by the bandpass filter 36*b*. The threshold detector 146 may comprise a Schmidt trigger or the like, and the delay circuit 144 may comprise a Schmidt trigger with an integrator at its input, to delay toggling. When the delay circuit toggles, it indicates that the receiver 36 is (and has been, during the delay) receiving a significant signal from a related, remotely-located transmitter so that the oscillator 14 of this transceiver (operating in a slave mode) may be locked to the remote transmitter offset therefrom by the IF frequency of the receiver 36, so that the oscillator 14 can act as the local oscillator to produce the IF frequency in the single ended mixer 32. This also causes the transmission of this transceiver to be offset from the oscillator of the remote transceiver by its IF frequency, since they have the same design IF. The delay circuit 144 is provided in order to avoid response to noise, other unrelated transceivers, or other spurious signals. When there is an output from the delay circuit 144 and the switch 62 is in the slave position as shown in FIG. 1, a signal on the line 142 will enable an AFC input circuit 152 to provide the AFC signal from the AFC circuit 42 to a line 154 for filtering in the sweep and integrator circuit 140 and application as the carrier frequency controlling DC voltage on the line 12.

If frequency stability is desired to be established without waiting for normal modulation, such as when only the related transceiver is sending or when both are quiescent, then substitute modulation may be put on the input line 2 by any suitable known means. For instance, standard T-1 type telephone data transmission provides a data pattern during quiescence.

In the master mode, operation consists of slewing the oscillator until the cavity frequency is reached, after which closed loop control through the cavity and the phase sensitive demodulator swamps out the effect of the sweep circuit, and the oscillator becomes locked to the frequency of the tuning cavity, as is described in more detail in my aforementioned similar application. When in the master mode, this stabilized operation continues indefinitely, and the AFC input through the resistor 184 is not permitted since the transistor 170 conducts and causes the AFC input line 154 to be at the reference potential of the line 164, which as illustrated herein is taken to be the base bias voltage potential of the amplifier 166, such that there is substantially no current through the resistor 184 and it has not effect on the output of the operational amplifier 166.

However, when the transceiver unit has its switches in the positions shown in FIGS. 1 and 2 to cause operation in the slave mode, not only does the foregoing operation of sweeping and locking on to a frequency on the skirt of the turning cavity characteristic occur, but thereafter an additional function is provided by means of the slave enable AFC signal on the line 142, which will become present when the transceiver starts to receive significant transmissions from a related, remotely-located transceiver operating in the master mode with a cavity having the same resonant frequency as the cavity 116 herein. Because the oscillator 14 in one transceiver of a duplex pair is adjusted to have a center frequency which is separated from the center frequency of the oscillator in the other transceiver in the same duplex pair by the IF frequency of each of the transceivers (such as 20 MFz), the one of the transceivers which is operating in the slave mode can first lock its oscillator to the skirt of its own tuning cavity, which should be exactly the same as the frequency required of its oscillator in order that the portion of the oscillator energy leaked through the orthomode transducer to the single ended mixer will cause a beat frequency at the IF frequency. In other words, once the slave receiver is locked to the skirt of its own oscillator, it may then transfer to AFC operation so that it will precisely track the frequency of the related transceiver, with practically no chance of jumping to another frequency related to that at which some other transceiver is operating. This is achieved (as disclosed and claimed in my aforementioned similar application) by preventing the slave transceiver from operating in response to AFC until at least several seconds after the device is in operation and a signal has been sensed through its own receiver, indicating that it is getting transmissions from its related transceiver and that its oscillator is tuned to approximately the correct frequency, on the skirt of its cavity. When this happens, the delay unit 144 provides, through the switch 62, the slave enable AFC signal on the line 142 which removes the shunt effect of the transistor 170 (FIG. 2) thereby allowing AFC input to the integrating amplifier 166 while at the same time it shunts out the input of the cavity loop by means of the transistor 162 (FIG. 2). Thus, AFC operation cannot result from other than an IF signal derived from mixing a received wave with the leakage from the oscillator 14 after the slave oscillator has locked on to the skirt of the tuning cavity 116, since any IF signals spuriously received while the oscillator is tuning will be ignored due to the delay unit 144.

This is a significant aspect of the present invention since it virtually assures that the oscillator of a slave transceiver will lock onto only the correct transceiver which is assigned thereto in a duplex pair, by having the cavity frequencies adjusted to be the same, and by initially tuning the slave transceiver to a point on the skirt of its cavity separated by the design IF frequency of both units from its center frequency.

It is immaterial whether the master oscillator frequency is higher or lower than the slave oscillator frequency since either can operate on either the upper or the lower sideband. What is desired, however, is that both transceivers will be able to cancel modulation at the operational amplifier 48 (FIG. 1) by providing a correct polarity of discriminator output, which in turn is achieved by relating the polarity of the output of the variable gain amplifier 4 to the fact that the slave is higher or lower than the master in its assigned carrier frequency. If these happen to be reversed, then the signals on the resistors 50, 52 will add rather than subtract from one another since they will be of the same polarity. This is easily corrected by reversing the polarities of the output of the variable gain amplifier 4, and by taking into account the polarity of the diode **180*d*** with respect to desired fast and slow sweeps for skirt lockon.

The relationship between the polarity at the output of the video amplifier 130 to the polarity of the output of the variable gain amplifier 4 is maintained by correct polarity of the master and slave positions of the switch 44 so that the output of the phase sensitive demodulator 136 will be of a sense that it will drive the oscillator 14 toward the center frequency of the tuning cavity 116 instead of away from it when in the master mode. But when in the slave mode, the demodulator operates on the same sideband, and since the switch 44 has reversed the polarity of transmitter input, the demodulator will buck the Schmidt trigger to establish operation off resonance, which is adjustable to be off by the common IF frequency.

In FIG. 2, a second aspect of the present embodiment relates to the fact that the initial sweeping of the DC signal on the line 12, to cause a commensurate sweeping of the voltage-tunable solid state oscillator 14 is in response to a Schmidt trigger, which no longer is toggled once a significant cavity center or skirt signal takes over control of the operational amplifier 166. This eliminates any need for switching-out of the sweep circuit as is common in the prior art. The effects that the Schmidt trigger has, once the output of the operational amplifier 166 has stabilized at some voltage (which is between the upper and lower input thresholds of the Schmidt trigger 178) is that its output provides an extremely small DC bias to the input of the operational amplifier 166 in the master mode and after AFC lock-on in the slave mode, and bucks the demodulator input when tuned to the skirt before AFC lock-on in the slave mode. However, this is accommodated by virtue of the feedback through the oscillator tuning cavity, and the effect of the small bias due to the Schmidt trigger output on the operational amplifier is orders of magnitude lower than the effects of the signal resulting from the tuning cavity or AFC.

An additional aspect of the present embodiment is that the integrating amplifier provided by the operational amplifier 166 and its feedback capacitor 176 automatically functions as a low pass filter to filter the output of the phase sensitive demodulator 136 and to filter the AFC output from the discriminator 36*g*, thereby avoiding the need for additional filter circuits. These two aspects of the present embodiment contribute to overall low cost which is required for maximum utilization of microwave transceivers, as described briefly hereinbefore.

The exemplary embodiment disclosed herein is readily implemented with known technology utilizing components available in the market. The oscillator 14 may comprise a varactor tuned oscillator of a known type which includes a suitably biased Gunn-effect solid state device in a cavity having a varactor diode tuning loop controlled by the input voltage. One such device which is useful for carrier frequencies on the order of 40 GHz is sold under the designation VSQ-9021 by VARIAN, Palo Alto, California. On the other hand, as disclosed in my aforementioned basic application, it may instead comprise a voltage variable Gunn oscillator, comprising simply a Gunn device in which the bias is used for frequency control. The voltage/frequency characteristic — particularly polarity — may vary from that shown herein. Exemplary sources for the orthomode transducer, the single ended mixer, a suitable FM receiver, and the variable gain amplifier are given in my aforementioned basic application.

In place of the orthomode transducer 20, circulators which are readily available in the marketplace may be utilized. Similarly, the precepts of the present invention do not require the use of a single ended mixer, in which case a circulator without any controlled leakage may be used in place of the orthomode transducer and a separate waveguide feedpath provided to a balanced mixer from the output of the oscillator 14, in a way which is more nearly commensurate with the teachings of the prior art.

Similarly, the tuning cavity 116 may simply comprise a cylindrical waveguide resonant transmission cavity having a suitably high Q, the characteristics of which may include a center frequency on the order of 16 GHz or 17 GHz, with half power points on the order of ±5 MHz from the center frequency, with waveguide input and output. Such a device is available under the designation BL499 from VARIAN, Beverly, Mass. The amplifiers, demodulators, threshold detector, delay circuits and other components are similarly well-known and available as off the shelf catalog offerings from a variety of sources.

Control over the relative polarity of the oscillator modulation when in the slave mode and the poling of the diode 180*d* will determine which skirt (above or below the center frequency) the slave will tune to, and therefore whether the slave will be above or below the master (to fit within an assigned channel). As shown in my aforementioned basic application, polarity control for transmitter modulation cancellation in the receiver can be effected in the receiver, rather than by controlling polarity of input modulation, as shown by the switch 44 herein. In such a case the slave will still lock on to a suitable skirt and the polarity of the slave can be adjusted for operation above or below the frequency of the master in any obvious fashion.

Thus, although the invention has been shown and described with respect to a preferred embodiment thereof, it should be understood by those skilled in the art that the foregoing and various other changes, omissions and additions may be made thereto without departing from the spirit and the scope of the invention.

Having thus described a typical embodiment of my invention, that which I claim as new and desire to secure by Letters Patent of the United States is:

1. In a transceiver, adapted for use in a duplex transceiver system including a pair of such transceivers settable for operation with one in a master mode and one in a slave mode, said transceiver comprising:

a single, voltage-tunable oscillator having means for providing a frequency-controlling voltage input thereto;

an FM receiver, having the same IF frequency in the master mode as in the slave mode;

antenna means for transmitting and receiving microwave energy;

frequency stability means including resonant means responsive to the energy output of said oscillator to provide a feedback signal dependent on the closeness of the frequency of the output of said oscillator to the resonant frequency of said resonant means within a band of frequency differences, the resonant means having the same resonant frequency in the master mode as in the slave mode;

means for coupling energy from said oscillator to said antenna means for transmission thereby, for coupling a small portion of the energy of said oscillator to said frequency stability means, and for simultaneously coupling energy received at said antenna means and a small portion of the energy of said oscillator to the input of said FM receiver; and frequency control means including means providing an initial frequency sweep controlling voltage to the input of said oscillator to thereby sweep the frequency of said oscillator to a frequency within said band of frequencies, and having an input connected for response to the feedback signal output of said resonant means, for providing a frequency control voltage to the frequency-controlling voltage input means of said oscillator, and further including means settable to designate said transceiver for operation in the master mode or the slave mode, and operable when set in the slave mode to provide said frequency control voltage in response to said feedback signal to establish operation of said oscillator at a frequency separated from said center frequency by said IF frequency, and operable when set in the master mode to provide said frequency control voltage in response to said feedback signal to establish operation of said oscillator at said center frequency.

2. The improvement according to claim 1 wherein said frequency control means includes means operable when set in the slave mode to provide said initial sweep controlling voltage of a polarity and magnitude to cancel said feedback signal to provide said frequency control voltage of a magnitude to establish operation of said oscillator at a frequency offset from said center frequency by said IF frequency, and means operable when in the master mode to provide said initial sweep controlling voltage of a polarity to add with said feedback signal and of a magnitude to have a significantly smaller effect on said frequency control voltage than does said feedback voltage.

3. A transceiver, adapted for use in a duplex transceiver system including a pair of such transceivers settable for operation with one in a master mode and one in a slave mode, said transceiver comprising:

a single, voltage-tunable, solid state microwave oscillator having means for providing a frequency-controlling voltage input thereto;

an FM receiver, having the same IF frequency in the master mode as in the slave mode, and providing conventional AGC and AFC signals;

antenna means for transmitting and receiving microwave energy;

frequency stability means including resonant means responsive to the energy output of said oscillator to provide a feedback signal dependent on the closeness of the frequency of the output of said oscillator to the resonant frequency of said resonant means within a band of frequency differences, resonant means having the same resonant frequency in the master mode as in the slave mode;

means for coupling energy from said oscillator to said antenna means for transmission thereby, for coupling a small portion of the energy of said oscillator to said frequency stability means, and for simultaneously coupling energy received at said antenna means and a small portion of the energy of said oscillator to the input of said FM receiver;

frequency control means including means providing an initial frequency sweep controlling voltage to the input of said oscillator to thereby sweep the frequency of said oscillator to a frequency within said band of frequencies, and having a pair of selectively operable inputs, a first of said inputs connected for response to the AFC signal output of said FM receiver and a second of said inputs connected for response to the feedback signal output of said resonant means, for providing a frequency control voltage to the frequency-controlling voltage input means of said oscillator in response to said AFC signal or said feedback signal in dependence upon the respective one of said inputs being operable; and AFC enabling means responsive to the AGC signal output of said FM receiver, and settable to designate said transceiver for operation in either the master mode or the slave mode, for enabling said first input of said frequency control means in response to said AGC signal exceeding a predetermined magnitude with said AFC enabling means set to designate the slave mode, and otherwise to enable said second input of said frequency control means in the absence of an AGC signal of said predetermined magnitude or with said AFC enable means set to designate said master mode;

the improvement in which said frequency control means includes means settable along with said AFC enabling means to designate said transceiver for operation in the master mode or the slave mode and operable when set in the slave mode to provide, in the absence of said AFC enabling means enabling said first input, said frequency control voltage in response to said feedback signal to establish operation of said oscillator at a frequency separated from said center frequency by said IF frequency.

4. The improvement according to claim 3 wherein said frequency control means includes means operable when set in the slave mode to provide said initial sweep controlling voltage of a polarity and magnitude to cancel said feedback signal to provide said frequency control voltage in a magnitude to establish operation of said oscillator at a frequency offset from said center frequency by said IF frequency.

5. The improvement according to claim 4 wherein said frequency control means includes means operable when in the master mode to provide said initial sweep controlling voltage of a polarity to add with said feedback signal and of a magnitude to have a significantly smaller effect on said frequency control voltage than does said feedback voltage.

6. In a duplex transceiver system including a pair of transceivers settable for operation with one in a master mode and one in a slave mode, each of said transceivers comprising:

a single, voltage-tunable, solid state microwave oscillator having means for providing a frequency-controlling voltage input thereto;

an FM receiver, having the same IF frequency in both of said transceivers and providing conventional AGC and AFC signals;

antenna means for transmitting and receiving microwave energy;

frequency stability means including resonant means responsive to the energy output of said oscillator to provide a feedback signal dependent on the closeness of the frequency of the output of said oscillator to the resonant frequency of said resonant means within a band of frequency differences, the resonant means in both of said transceivers having the same resonant frequency;

means for coupling energy from said oscillator to said antenna means for transmission thereby, for coupling a small portion of the energy of said oscillator to said frequency stability means, and for simultaneously coupling energy received at said antenna means and a small portion of the energy of said oscillator to the input of said FM receiver;

frequency control means including means providing an initial frequency sweep controlling voltage to the input of said oscillator to thereby sweep the frequency of said oscillator to a frequency within said band of frequencies, having a pair of selectively operable inputs, a first of said inputs connected for response to the AFC signal output of said FM receiver and a second of said inputs connected for response to the feedback signal output of said resonant means, for providing a frequency control voltage to the frequency-controlling voltage input means of said oscillator in response to said AFC signal or said feedback signal in dependence upon the respective one of said inputs being operable; and AFC enabling means responsive to the AGC signal output of said FM receiver, and settable to designate the related transceiver in either the master mode or the slave mode, for enabling said first input of said frequency control means in response to said AGC signal exceeding a predetermined magnitude with said AFC enabling means set to designate the slave mode, and otherwise to enable said second input of said frequency control means in the absence of an AGC signal of said predetermined magnitude or with said AFC enable means set to designate said master mode;

the improvement in which said frequency control means includes means settable along with said AFC enabling means to designate said transceiver for operation in the master mode or the slave mode and operable when set in the slave mode to provide, in the absence of said AFC enabling means enabling said first input, said frequency control voltage in response to said feedback signal to establish operation of said oscillator at a frequency separated from said center frequency by said IF frequency.

7. The improvement according to claim 6 wherein said frequency control means includes means operable when set in the salve mode to provide said initial sweep controlling voltage of a polarity and magnitude to cancel said feedback signal to provide said frequency control voltage in a magnitude to establish operation of said oscillator at a frequency offset from said center frequency by said IF frequency.

8. The improvement according to claim 7 wherein said frequency control means includes means operable when set in the master mode to provide said initial sweep controlling voltage of a polarity to add with said feedback signal and of a magnitude to have a significantly smaller effect on said frequency control voltage than does said feedback voltage.

* * * * *

UNITED STATES PATENT OFFICE

CERTIFICATE OF CORRECTION

PATENT NO. : 3,925,729

DATED : December 9, 1975

INVENTOR(S) : Salvatore Amoroso, Jr.

It is certified that error appears in the above-identified patent and that said Letters Patent are hereby corrected as shown below:

Column 4, line 12, "of" should read --on--

Column 5, line 25, "of" should read --by--

Column 6, line 56, "129" should read --124--

Column 8, line 27, "a" should read --of--

Column 9, line 37, "not" should read --no--

Column 9, line 43, "turning" should read --tuning--

Column 9, line 55, "MFz" should read --MHz--

Signed and Sealed this

*twenty-fifth* Day of *May 1976*

[SEAL]

*Attest:*

RUTH C. MASON
*Attesting Officer*

C. MARSHALL DANN
*Commissioner of Patents and Trademarks*